(12) United States Patent
Hoang et al.

(10) Patent No.: US 10,096,726 B2
(45) Date of Patent: Oct. 9, 2018

(54) ALL FRONT CONTACT SOLAR CELL

(71) Applicant: Space Systems/Loral, LLC, Palo Alto, CA (US)

(72) Inventors: Bao Hoang, San Francisco, CA (US); Samuel Geto Beyene, San Leandro, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 0 days.

(21) Appl. No.: 14/734,996

(22) Filed: Jun. 9, 2015

(65) Prior Publication Data
US 2016/0365468 A1    Dec. 15, 2016

(51) Int. Cl.
| | |
|---|---|
| H01L 31/00 | (2006.01) |
| H01L 31/0224 | (2006.01) |
| H01L 31/05 | (2014.01) |
| H01L 31/068 | (2012.01) |
| H01L 31/18 | (2006.01) |

(52) U.S. Cl.
CPC .. *H01L 31/022433* (2013.01); *H01L 31/0504* (2013.01); *H01L 31/068* (2013.01); *H01L 31/1804* (2013.01); *Y02E 10/547* (2013.01); *Y02P 70/521* (2015.11)

(58) Field of Classification Search
CPC ...................................................... H01L 31/00
See application file for complete search history.

(56) References Cited

U.S. PATENT DOCUMENTS

| | | | | |
|---|---|---|---|---|
| 3,480,783 | A | * | 11/1969 | Mankarious ............ H01L 31/00 250/239 |
| 5,100,808 | A | | 3/1992 | Glenn |
| 7,842,521 | B2 | | 11/2010 | Limb |
| 8,247,243 | B2 | | 8/2012 | Sheats et al. |
| 8,394,650 | B2 | | 3/2013 | Chung |
| 8,766,090 | B2 | | 7/2014 | Sewell et al. |
| 2009/0288702 | A1 | * | 11/2009 | Kim ................ H01L 31/022433 136/251 |
| 2012/0234369 | A1 | | 9/2012 | Everett et al. |

* cited by examiner

*Primary Examiner* — Uyen M Tran
(74) *Attorney, Agent, or Firm* — Weaver Austin Villeneuve & Sampson LLP

(57) ABSTRACT

A photovoltaic solar cell, including an N-side layer proximate to a first planar surface and a P-side layer proximate to a second planar surface that is opposite to the first planar surface, is formed from a circular wafer substrate. An N-side conductive contact is electrically coupled with the N-side layer, and a P-side conductive contact electrically coupled with the P-side layer. The P-side conductive contact and the N-side conductive contact are each disposed proximate to the first planar surface, the circular wafer substrate includes an edge exclusion zone, and the P-side contact is disposed within or proximate to the edge exclusion zone.

6 Claims, 9 Drawing Sheets

View G-G

ALL FRONT CONTACT SOLAR CELL

TECHNICAL FIELD

This invention relates generally to photovoltaic solar cells, and, more particularly, to improved configurations of a solar cell and interconnection techniques for solar cells.

BACKGROUND OF THE INVENTION

The assignee of the present invention designs and manufactures spacecraft for communications and broadcast services. Electrical power for such spacecraft is conventionally generated by photovoltaic solar arrays, typically having several thousands of solar cells.

Solar cells of numerous varieties are known, but typical features of the types of cells with which the present inventors are concerned, are illustrated in FIG. 1. Referring to Detail A of FIG. 1, cell 100 has a semiconductor substrate 110 having a base region or layer ("P-side") 112 formed of a first conductivity type below or behind an emitter region or layer ("N-side") 114 of opposite conductivity type. A metallized conductor on the back surface of the P-side forms a first electrode ("back contact") will. A grid on the front surface of the emitter region, which surface is the light receiving surface, forms a second electrode ("front contact"). The grid, typically composed of fine metallic lines 130, is conductively coupled to at least one current collector bar 140. For improved packing densities, cells having a substantially square or rectangular footprint are preferable. Referring to detail (B), a substantially square solar cell 100 may be formed from a substantially circular wafer 170. Alternatively, two similarly sized substantially rectangular cells 100a and 100b may be formed from the circular wafer 170. It may be observed that the resulting square or rectangular solar cell may have one or more relatively short corner edge segments 150 disposed at an obtuse angle to main side edges 160.

Referring now to Detail C, in order to connect an electrical series (or "string") of solar cells, one or more cell interconnects 126 may be disposed between adjacent cells 100 that conductively couple the back surface electrode 120 of one cell 100(i) to the current collector bar 140 disposed in a front surface of adjacent cell 100(i−1) in the string.

As the demand for higher power spacecraft has grown, so has the demand for higher power solar arrays, each array typically consisting of two or more solar panels, with a consequent requirement to arrange even higher numbers of solar cells on each solar panel. This in turn places an increased emphasis on improving the ratio of solar cell area to solar panel area (hereinafter, "the panel packing ratio") and in achieving increased reliability and cost efficiencies in making the necessary electrical connections between cells.

In light of the foregoing, solar cell configurations, whether for space or for ground applications, that permit improvements in the above mentioned metrics, are desirable.

SUMMARY

The present inventors have appreciated that a solar cell may be configured to permit an all front contact (AFC) interconnector arrangement. The disclosed techniques permit a substantial decrease in solar array assembly costs. Importantly, the entire active area of the solar cell is still available, notwithstanding that a portion of the front surface of each cell is electrically coupled with a P-side contact.

According to some implementations, an apparatus includes a photovoltaic solar cell formed from a circular wafer substrate. The photovoltaic solar cell includes an N-side layer proximate to a first planar surface, a P-side layer proximate to a second planar surface, opposite to the first planar surface, an N-side conductive contact electrically coupled with the N-side layer, and a P-side conductive contact electrically coupled with the P-side layer. The P-side conductive contact and the N-side conductive contact are each disposed proximate to the first planar surface, the circular wafer substrate includes an edge exclusion zone, and the P-side contact is disposed within or proximate to the edge exclusion zone.

In some examples, the first planar surface may be a light receiving surface.

In some examples, the P-side contact may be disposed entirely within the edge exclusion zone.

In some examples, the N-side conductive contact may include a current collector bar that is conductively coupled with a grid of metallic lines.

In some examples, the circular wafer substrate may include an active area and the photovoltaic solar cell is configured to include a substantial portion of the active area and at least a portion of the edge exclusion zone. The N-side layer may include an inner portion that is substantially coextensive with the active area, and an outer portion disposed proximate to the edge exclusion zone, the inner portion being electrically isolated from the outer portion. The P-side conductive contact may be disposed proximate to the outer portion of the N-side layer.

In some examples, the edge exclusion zone may be an annular region disposed proximate to a perimeter of the circular wafer.

According to some implementations, a solar panel includes at least one string of series connected photovoltaic solar cells and a plurality of cell interconnects. One or more of the solar cells is formed from a circular wafer substrate, including an N-side layer proximate to a first planar surface and a P-side layer proximate to a second planar surface, opposite to the first planar surface. An N-side conductive contact is electrically coupled with the N-side layer and a P-side conductive contact electrically coupled with the P-side layer. The P-side conductive contact and the N-side conductive contact are each disposed proximate to the first planar surface. The circular wafer substrate includes an edge exclusion zone and each solar cell in the string is electrically connected to at least one adjacent solar cell in the string by way of at least one of the cell interconnects.

In some examples, a first solar cell in the string may be electrically connected with a second solar cell in the string only by way of at least one of the cell interconnects, the at least one cell interconnect extending between a respective P-side conductive contact of the first solar cell and a respective N-side contact of the second solar cell. Substantially all of the at least one cell interconnect may be disposed proximate to the first planar surface.

In some examples, the N-side conductive contact may include a current collector bar that is conductively coupled with a grid of metallic lines.

In some examples, the circular wafer substrate may include an active area and the photovoltaic solar cell may be configured to include a substantial portion of the active area and at least a portion of the edge exclusion zone. The N-side layer may include an inner portion that is substantially coextensive with the active area, and an outer portion may be disposed proximate to the edge exclusion zone, the inner portion being electrically isolated from the outer portion.

According to some implementations, a method includes fabricating a photovoltaic solar cell from a circular wafer substrate, the circular wafer substrate including a P-side layer. The fabricating step includes forming an N-side layer above and proximate to the P-side layer, the N-side layer being proximate to a first planar surface, etching a selected region of the N-side layer, such that a first portion of an upper surface of the P side layer proximate to the first planar surface is exposed, and applying respective metallization layers, a first respective metallization layer forming an N-side conductive contact with the N-side layer and a second respective metallization layer forming a P-side conductive contact with the p-side layer. The circular wafer substrate includes an edge exclusion zone and the P-side conductive contact is disposed within or proximate to the edge exclusion zone.

In some examples, the P-side contact may be disposed entirely within the edge exclusion zone.

In some examples, the circular wafer substrate may include an active area and the photovoltaic solar cell may be configured to include a substantial portion of the active area and at least a portion of the edge exclusion zone. The N-side layer may include an inner portion that is substantially coextensive with the active area, and an outer portion disposed proximate to the edge exclusion zone, the inner portion being electrically isolated from the outer portion.

According to some implementations, a method includes fabricating a photovoltaic solar cell from a circular wafer substrate, the circular wafer substrate including a P-side layer and an edge exclusion zone. The fabricating step includes applying a mask to at least a portion of the edge exclusion zone to form a masked region; forming an N-side layer above and proximate to a P-side layer, the N-side layer being proximate to a first planar surface and being disposed in an area that excludes the masked region, removing the mask, and applying respective metallization layers, a first respective metallization layer forming an N-side conductive contact with the N-side layer and a second respective metallization layer forming a P-side conductive contact with the p-side layer. The P-side conductive contact is disposed within or proximate to the edge exclusion zone.

In some examples, the P-side contact may be disposed entirely within the edge exclusion zone.

In some examples, the circular wafer substrate may include an active area and the photovoltaic solar cell may be configured to include a substantial portion of the active area and at least a portion of the edge exclusion zone. The N-side layer may include an inner portion that is substantially coextensive with the active area, and an outer portion disposed proximate to the edge exclusion zone, the inner portion being electrically isolated from the outer portion.

BRIEF DESCRIPTION OF THE DRAWINGS

Features of the invention are more fully disclosed in the following detailed description of the preferred embodiments, reference being had to the accompanying drawings, in which.

Figure 1:
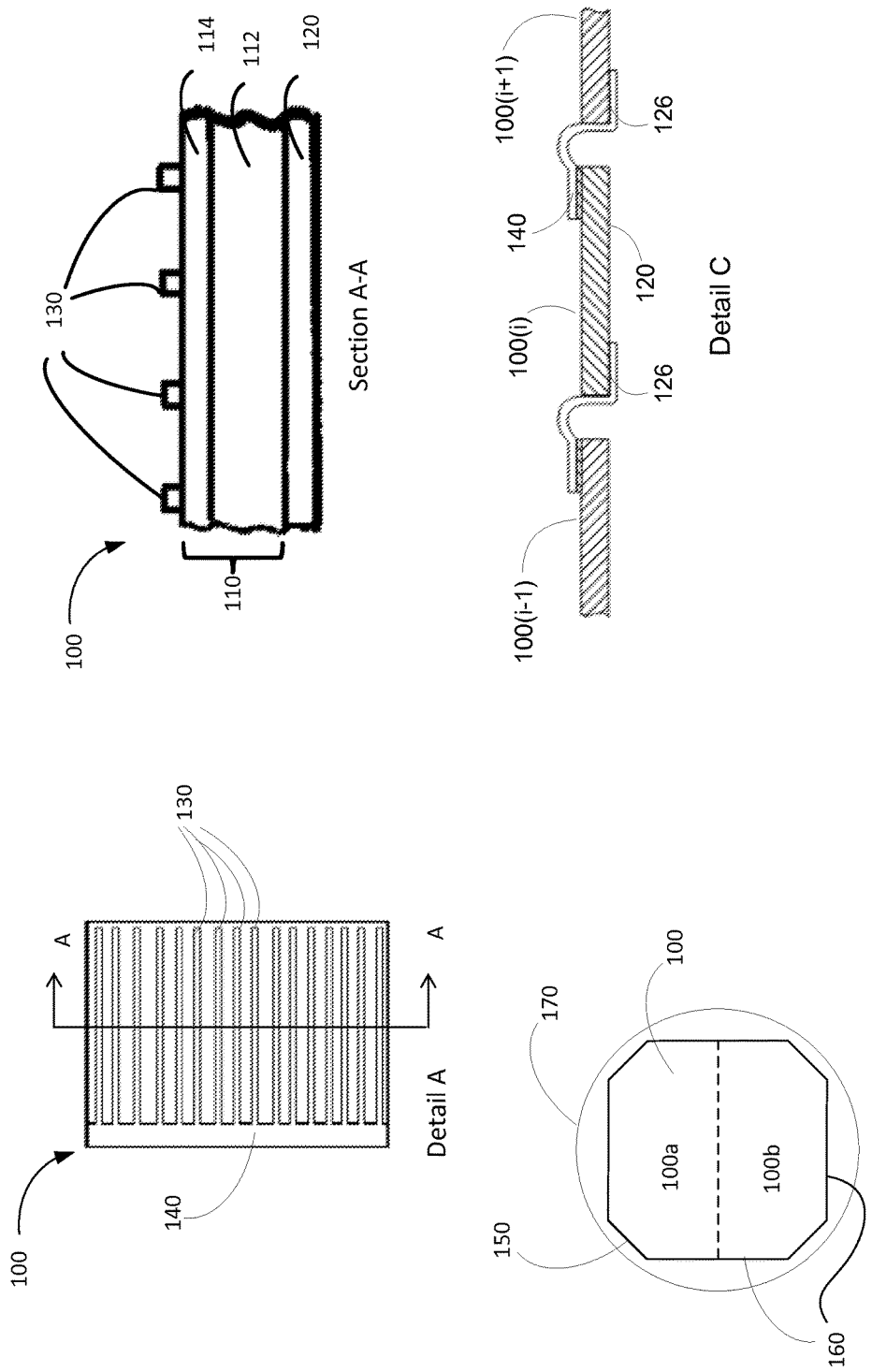
FIG. 1 illustrates examples of solar cells of the prior art.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the subject invention as defined by the appended claims.

DETAILED DESCRIPTION

Specific examples of embodiments will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element, or intervening elements may be present. It will be understood that although the terms "first" and "second" are used herein to describe various elements, these elements should not be limited by these terms. These terms are used only to distinguish one element from another element. As used herein, the term "and/or" includes any and all combinations of one or more of the associated listed items. The symbol "/" is also used as a shorthand notation for "and/or".

Figure 2:
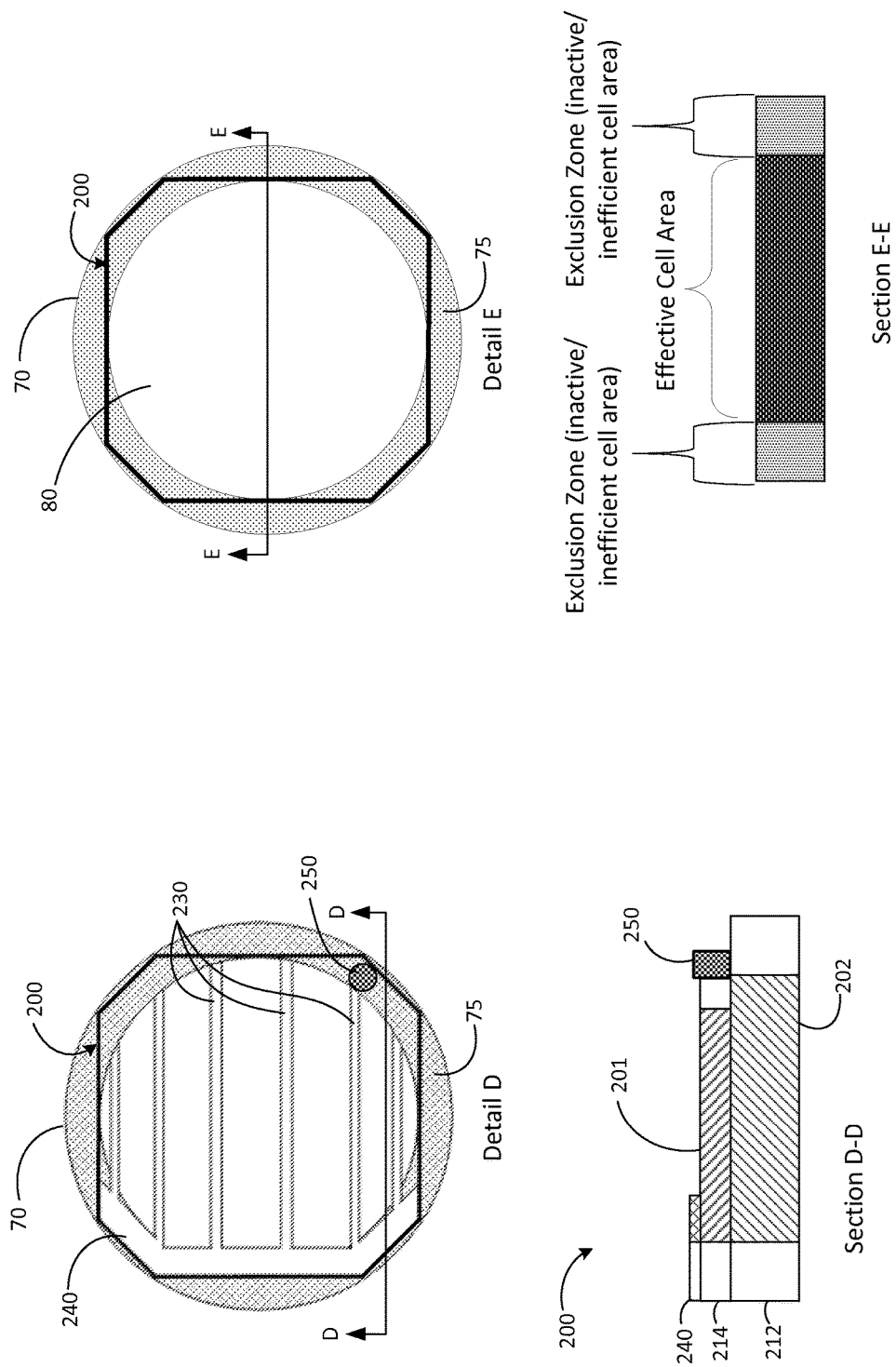
FIG. 2 illustrates an example of a solar cell according to an implementation.

According to an implementation of the presently disclosed techniques, referring now to Detail D of FIG. 2, a photovoltaic solar cell 200 may be formed from a circular wafer substrate 70. Referring to Section D-D of FIG. 2, the photovoltaic solar cell 200 may include an N-side layer 214 disposed behind and proximate to a first planar surface 201. The first planar surface may be the "front" or "light receiving surface" of the photovoltaic solar cell 200. A P-side layer 212 may be disposed proximate to a second planar surface 202 that is opposite to the first planar surface 201. The second planar surface 202 may be referred to as the "back" or "rear" surface of the photovoltaic solar cell 200. An N-side conductive coupling 240 is electrically coupled with the N-side layer 214. In an implementation, the N-side conductive coupling 240 may be a current collector bar that is conductively coupled with a grid of metallic lines 230. A P-side conductive coupling 250 is electrically coupled with the P-side layer 212. Advantageously, both the N-side conductive coupling 240 and the P-side conductive coupling 250 may be disposed proximate to the front surface 201. As will be described in more detail hereinbelow, the circular wafer substrate 70 may include an annular edge exclusion zone 75. It is contemplated that the P-side conductive coupling 250 will be disposed substantially within or proximate to the edge exclusion zone 75.

Referring now to Detail E of FIG. 2, the edge exclusion zone 75 of circular wafer 70, proximate to the wafer edge, is typically unavailable for energy generation because defects in wafer quality proximate to an edge of the circular wafer are difficult to avoid. Consequently, an interior, substantially circular, portion 80 of the wafer 70 may be referred to as the "active area" that is surrounded by the annular edge exclusion zone 75. As shown in the example implementation of Detail E of FIG. 2, the photovoltaic solar cell 200 may be formed from the circular wafer 70 such that it includes most, or all of the active area 80, and also includes some portion of the edge exclusion zone 75.

Referring again to Section D-D of FIG. 2, because each of the N-side conductive coupling 240 and the P-side conductive coupling 250 is disposed proximate to the front surface 201, the illustrated arrangement may be referred to as an "all front contact" (AFC) solar cell.

Figure 3:
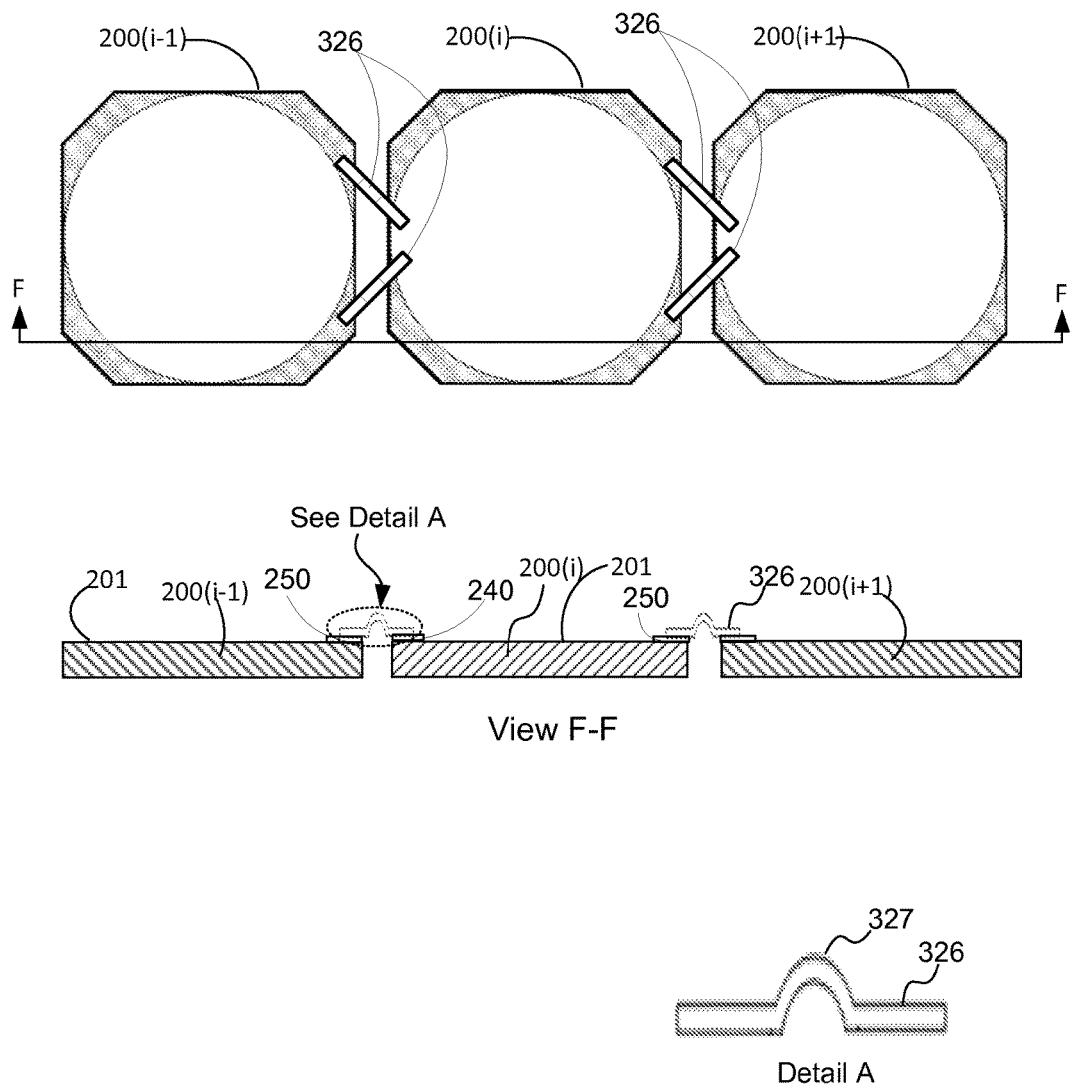
FIG. 3 illustrates an example of a string of solar cells according to an implementation.

Referring now to FIG. 3, the presently disclosed techniques contemplate that at least one AFC interconnect 326 may electrically couple an N-side conductive contact 240 proximate to the front side 201 of one cell 200(i) with a P-side conductive contact 250 proximate to the front side 201 of an adjacent cell 200 (i–1). As a result of the illustrated AFC arrangement, interconnection of solar cells in a string is made more economical. Because the AFC arrangement provides for both the N-side conductive coupling 240 and the P-side conductive coupling 250 to be disposed proximate to the front surface 201, manufacturing processes are simplified, and automation of some solar panel layup processes such as cell-to-module manufacturing may be enabled. To the extent that the P-side conductive coupling 250 is disposed within the edge exclusion zone 75, a loss of active solar cell area is avoided. Furthermore, the presently disclosed techniques permits the photovoltaic solar cell 200 to omit a back surface electrode such as the back surface electrode 120 described in connection with FIG. 1.

Figure 4:
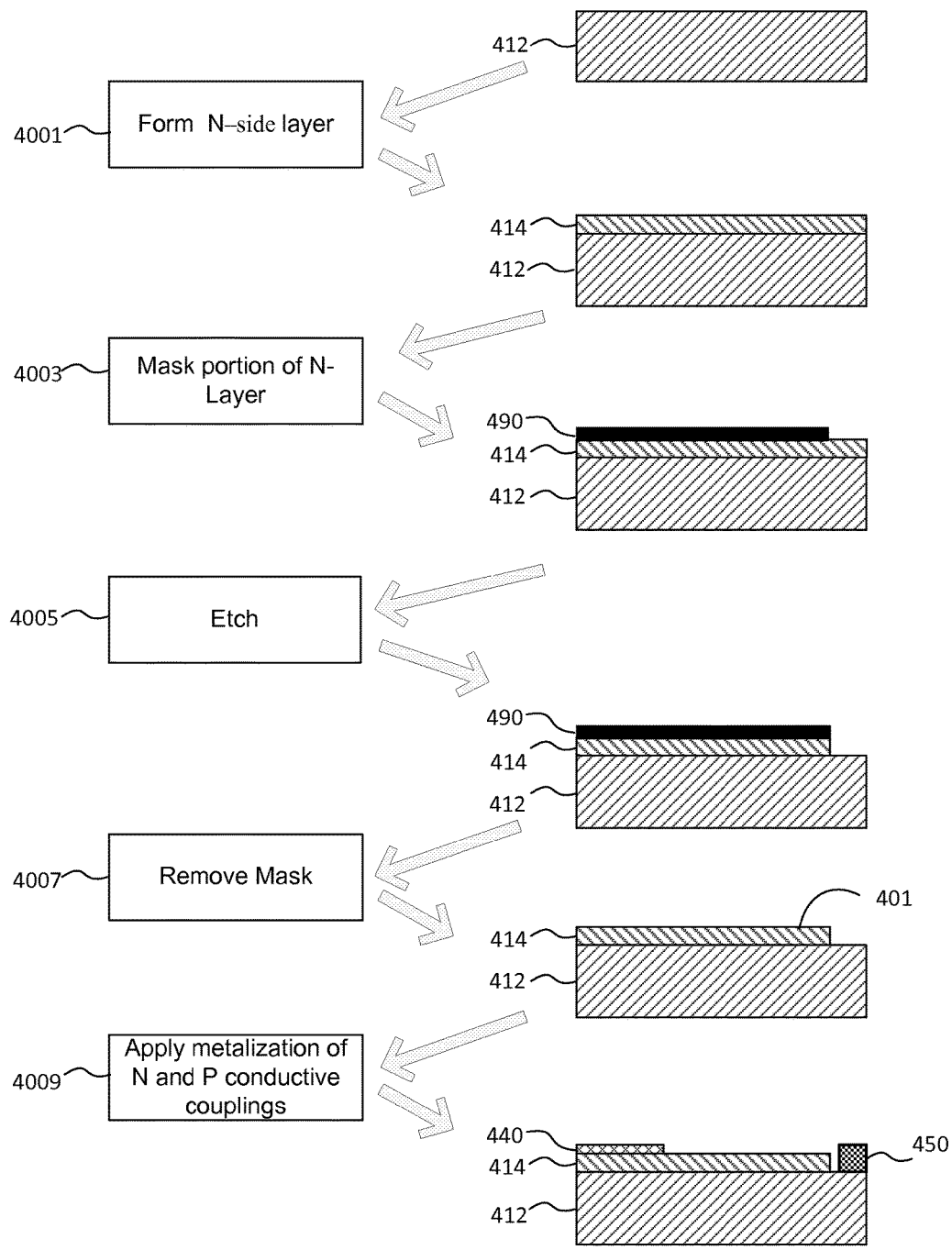
FIG. 4 illustrates a method of fabricating a solar cell, according to an implementation.

Referring now to FIG. 4, a first example of a fabrication process will be illustrated. In the illustrated implementation, the fabrication process may begin, at block 4001 by forming an N-side layer 414 above and proximate to a P-side layer 412. At block 4003, at least a first portion of the N-side layer 414 may be masked. More particularly, a mask layer 490 may be disposed on or above the N-side layer 414. A second portion of the N-side layer may remain unmasked. The second portion may be substantially within or proximate to an exclusion zone of a wafer substrate from which the P-side layer 412 is formed.

The process may continue, at block 4005, by etching away the second portion of the N-side layer 414, such that an upper surface of a corresponding portion of the P-side layer 412 is exposed. At block 4007 the mask layer 490 may be removed, thereby exposing a front surface 401 of the N-side layer 414. At block 4009, separate respective metallization layers may be applied to at least portions of the N-side layer 414 and the P-side layer 412. More particularly, the separate respective metallization layers may form an N-side conductive coupling 440 electrically coupled with the N-side layer 414 and a P-side conductive coupling 450 electrically coupled with the P-side layer 412.

Figure 5:
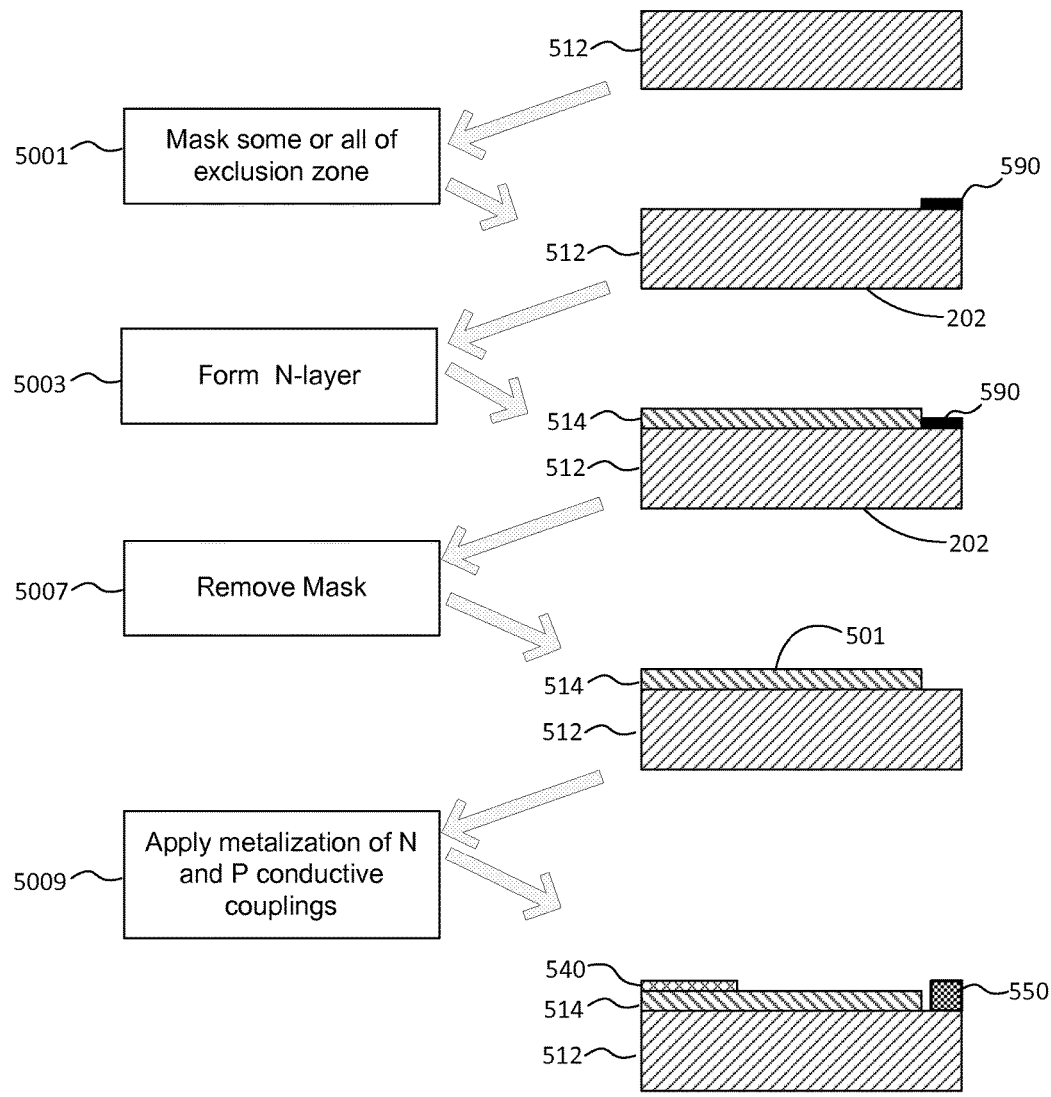
FIG. 5 illustrates a method of fabricating a solar cell, according to another implementation.

Referring now to FIG. 5, a second example of a fabrication process will be illustrated. In the illustrated implementation, the fabrication process may begin, at block 5001 by masking at least a portion of an exclusion zone of a wafer substrate from which a P-side layer 512 is formed. More particularly, a mask layer 590 may be disposed on or above the P-side layer 512, proximate to or substantially within the exclusion zone. At block 5003, an N-side layer 514 may be formed, outside the masked portion, above and proximate to the P-side layer 512. Advantageously, the N-side layer 514 may encompass all or a substantial portion of an active area of the wafer. At block 5007 the mask layer 590 may be removed, thereby exposing an upper surface of the P side layer 512 that is proximate to a front surface 501 of the N-side layer 514. At block 5009, separate respective metallization layers may be applied to at least portions of the N-side layer 514 and the P-side layer 512. More particularly, the separate respective metallization layers may form an N-side conductive coupling 540 electrically coupled with the N-side layer 514 and a P-side conductive coupling 550 electrically coupled with the P-side layer 512.

Figure 6:
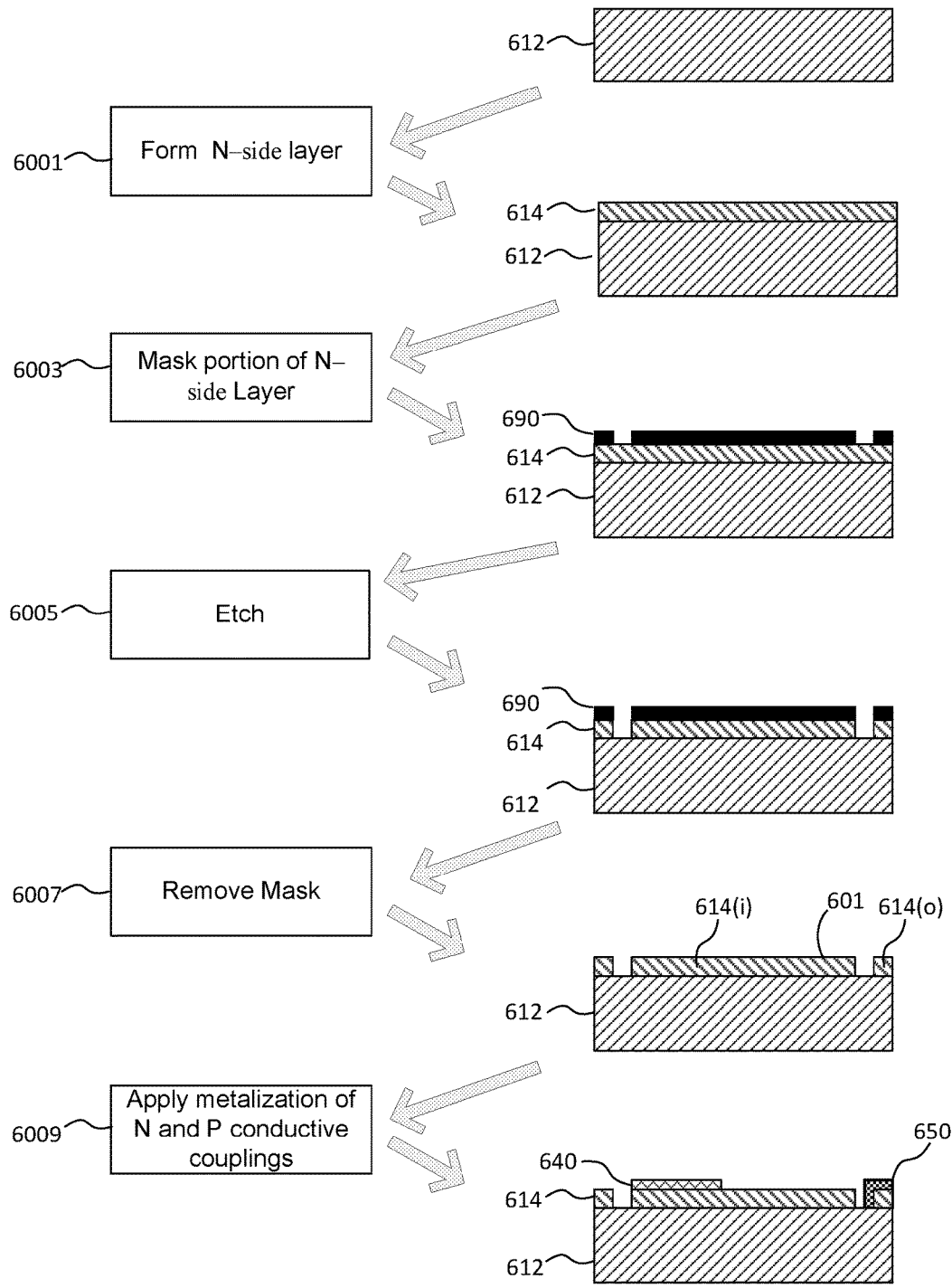
FIG. 6 illustrates a method of fabricating a solar cell, according to a yet further implementation.

Referring now to FIG. 6, a third example of a fabrication process will be illustrated. In the illustrated implementation, the fabrication process may begin, at block 6001 by forming an N-side layer 614 above and proximate to a P-side layer 612. At block 6003, selected portions of the N-side layer 614 may be masked. More particularly, a mask layer 690 may be disposed on or above the N-side layer 614. A second portion of the N-side layer may remain unmasked. For example, the mask layer 690 may be configured such that an annular portion of the N-side layer remains unmasked. More particularly, a substantially circular internal portion of the N-side layer may be masked that corresponds approximately to an active area of the wafer substrate from which P-side layer 612 is formed.

The process may continue, at block 6005, by etching away the second portion of the N-side layer 614, such that an upper surface of a corresponding portion of the P-side layer 412 is exposed. The corresponding portion of the P-side layer 412 may be or include a substantially circular annular region that is proximate to or contained within an exclusion zone of the wafer substrate from which the P-side layer 612 is formed. As a result of the etching process of block 6005, an inner region 614(i) of the N-side layer 614 may be electrically isolated from an outer region 614(o) of the N-side layer 614.

At block 6007 the mask layer 690 may be removed, thereby exposing a front surface 601 of the N-side layer 614(i). At block 6009, separate respective metallization layers may be applied to at least portions of the N-side layer 614 and the P-side layer 612. More particularly, the separate respective metallization layers may form an N-side conductive coupling 640 electrically coupled with the inner region 614(i) of the N-side layer 614 and a P-side conductive coupling 650 electrically coupled with the P-side layer 612.

Figure 7:
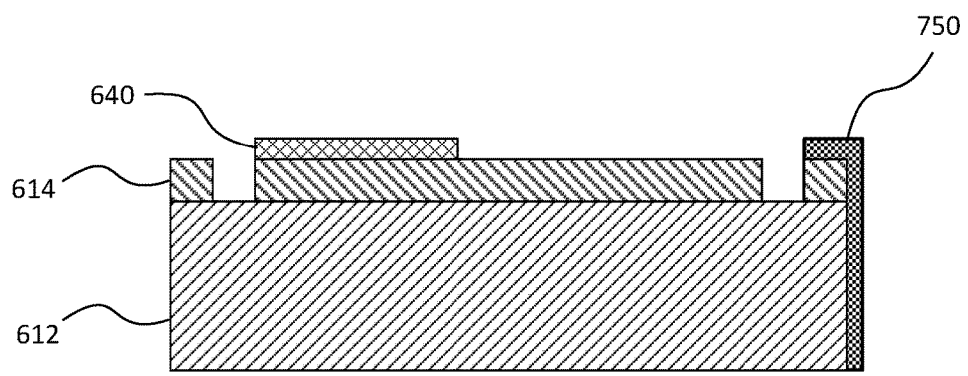
FIG. 7 illustrates a further example of a solar cell according to an implementation.

Referring still to FIG. 6, it may be observed that, in the illustrated configuration, the P-side conductive coupling 650 is disposed proximate to an upper surface and an inner surface of the outer portion 614(o) of the N-side layer 614. Other configurations are within the contemplation of the present inventors. For example, referring now to FIG. 7, a P-side conductive coupling 750 may be disposed proximate to an upper surface and an outer surface of the outer portion 614(o) of the N-side layer 614. An outer portion of the P-side conductive coupling 750 may extend all or a portion of an outer edge of the P-side layer 612.

Figure 8:
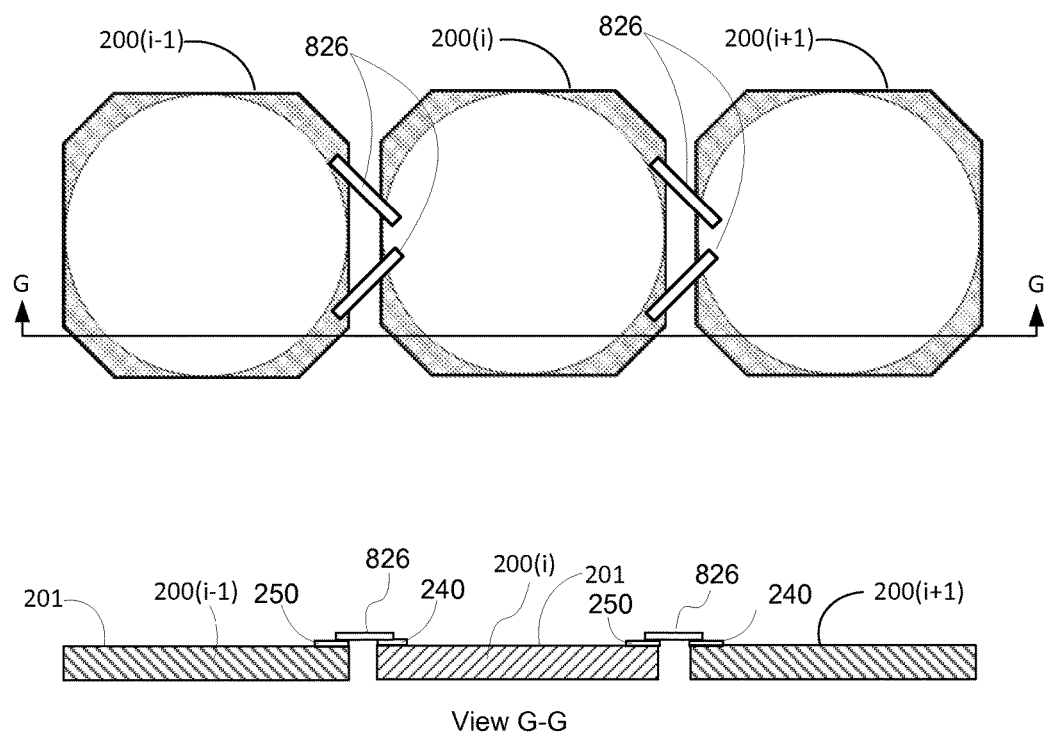
FIG. 8 illustrates a further example of a string of solar cells according to an implementation.

Referring again to FIG. 3, more particularly to Detail A, the at least one AFC interconnect 326 may include an out of plane portion 327 that may serve as a stress relief feature. Referring now to FIG. 8, at least one AFC interconnect 826 may electrically couple an N-side conductive contact 240 proximate to the front side 201 of one cell 200(i) to a P-side conductive contact 250 proximate to the front side 201 of an adjacent cell 200 (i–1). In the implementation illustrated in FIG. 8, the AFC interconnect 826 is substantially planar.

Figure 9:
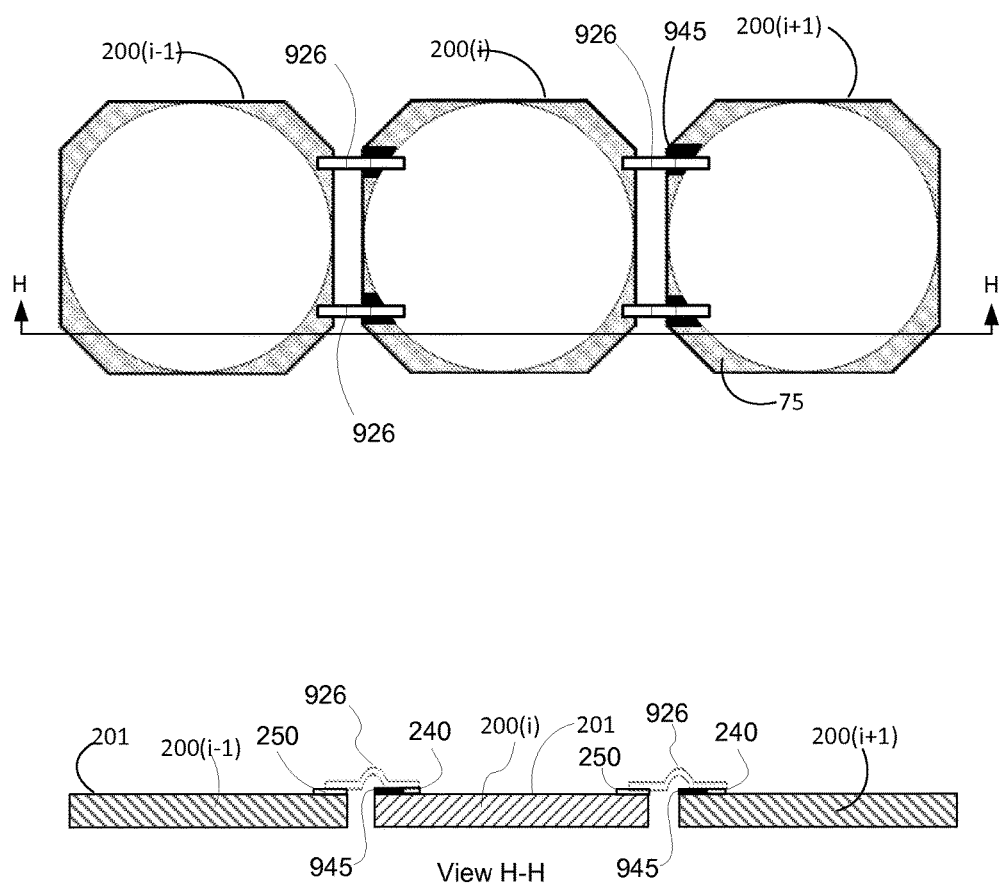
FIG. 9 illustrates a yet further example of a string of solar cells according to an implementation.

Referring now to FIG. 9, at least one AFC interconnect 926 may electrically couple an N-side conductive contact 240 proximate to the front side 201 of one cell 200(a P-side conductive contact 250 proximate to the front side 201 of an adjacent cell 200 (i–1). In the illustrated implementation, a layer 945 may be disposed between interconnect 926 and a portion of the front side 201 within the exclusion zone 75. The layer 945 may an insulating or dielectric coating layer, for example.

Thus, techniques have been disclosed, wherein an improved configuration of a solar cell permits an all front contact arrangement of cell interconnects to electrically couple adjacent cells. The foregoing merely illustrates principles of the invention. It will thus be appreciated that those skilled in the art will be able to devise numerous systems and methods which, although not explicitly shown or described herein, embody said principles of the invention and are thus within the spirit and scope of the invention as defined by the following claims.

What is claimed is:

1. A solar panel comprising:
   at least one string of series connected solar cells; and
   a plurality of cell interconnects; wherein
   one or more of the solar cells is formed from a circular wafer substrate, including an N-side layer proximate to a first planar surface and a P-side layer proximate to a second planar surface, opposite to the first planar surface;
   an N-side conductive contact is electrically coupled with the N-side layer and a P-side conductive contact electrically coupled with the P-side layer;
   the P-side conductive contact and the N-side conductive contact are each disposed proximate to the first planar surface;
   the circular wafer substrate includes an active area and an edge exclusion zone, the edge exclusion zone being an annular region disposed outside the active area proximate to a perimeter of the circular wafer substrate;
   a first portion of the N-side layer is disposed within the active area;
   a second portion of the N-side layer is disposed outside the active area and is electrically isolated from the first portion of the N-side layer, the second portion being non-contiguous with the first portion and separated from the first portion by a gap area that exposes the P-side layer;
   the P-side contact is disposed outside the active area, electrically coupled with one or both of the P-side layer and the second portion of the N-side layer and not electrically coupled with the first portion of the N-side layer; and
   each solar cell in the at least one string is electrically connected to at least one adjacent solar cell in the string by way of at least one of the cell interconnects.

2. The solar panel of claim 1, wherein a first solar cell in the string is electrically connected with a second solar cell in the string only by way of at least one of the plurality of cell interconnects, the at least one cell interconnect extending between a respective P-side conductive contact of the first solar cell and a respective N-side contact of the second solar cell.

3. The solar panel of claim 2, wherein substantially all of the at least one cell interconnect is disposed proximate to the first planar surface.

4. The solar panel of claim 1, wherein the N-side conductive contact includes a current collector bar that is conductively coupled with a grid of metallic lines.

5. The solar panel of claim 1, wherein the circular wafer substrate includes an active area, and the solar cell is configured to include a substantial portion of the active area and at least a portion of the edge exclusion zone.

6. The solar panel of claim 5, wherein the first portion is substantially coextensive with the active area, and the second portion is disposed proximate to the edge exclusion zone.

* * * * *